(12) United States Patent
Ko

(10) Patent No.: US 7,532,525 B2
(45) Date of Patent: May 12, 2009

(54) SEMICONDUCTOR MEMORY DEVICE FOR DECREASING THE TOTAL NUMBER OF DATA TRANSFER LINES

(75) Inventor: Jae-Bum Ko, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/529,178

(22) Filed: Sep. 27, 2006

(65) Prior Publication Data

US 2007/0268770 A1 Nov. 22, 2007

(30) Foreign Application Priority Data

May 16, 2006 (KR) .................. 10-2006-0043981

(51) Int. Cl.
*G11C 29/00* (2006.01)
(52) U.S. Cl. .............. 365/201; 365/189.18; 365/189.11
(58) Field of Classification Search .................. 365/201, 365/189.18, 189.11
See application file for complete search history.

(56) References Cited

U.S. PATENT DOCUMENTS

| | | | |
|---|---|---|---|
| 4,896,055 A * | 1/1990 | Fujii et al. .................... 326/13 |
| 6,169,438 B1 * | 1/2001 | Wu et al. ..................... 327/276 |
| 6,205,069 B1 | 3/2001 | Kim |
| 6,552,942 B2 | 4/2003 | Kim et al. |
| 6,813,204 B2 | 11/2004 | Kim et al. |
| 7,139,208 B2 * | 11/2006 | Arimoto et al. ............. 365/222 |
| 7,230,865 B2 * | 6/2007 | Lee ............................. 365/201 |
| 2004/0032776 A1 | 2/2004 | Kim et al. |
| 2006/0018168 A1 | 1/2006 | Kim |

FOREIGN PATENT DOCUMENTS

| | | |
|---|---|---|
| JP | 2003-143240 | 5/2003 |
| JP | 2005-317124 | 11/2005 |
| KR | 10-2005-0022855 | 3/2005 |
| KR | 10-2005-0106871 | 11/2005 |
| KR | 10-2006-0033431 | 4/2006 |
| KR | 10-0695437 | 3/2007 |

\* cited by examiner

*Primary Examiner*—Huan Hoang
*Assistant Examiner*—Kretelia Graham
(74) *Attorney, Agent, or Firm*—Blakely, Sokoloff, Taylor & Zafman LLP

(57) ABSTRACT

A memory device with global lines being used for other applications when the global lines are not in use is provided. The memory device includes: a plurality of banks; a global input/output line for transferring data input/output signals of the plurality of banks in a normal operation; and a bank selection signal transferring unit for transferring a plurality of test bank selection signals to the plurality of banks in a test mode.

15 Claims, 3 Drawing Sheets

SEMICONDUCTOR MEMORY DEVICE FOR DECREASING THE TOTAL NUMBER OF DATA TRANSFER LINES

FIELD OF THE INVENTION

The present invention relates to a semiconductor memory device, and more particularly, to a semiconductor memory device with global lines which can be used for other applications when the global lines are not in use.

DESCRIPTION OF RELATED ARTS

With higher performance and integration of semiconductor memory devices, endeavors for reducing a chip size have been also performed in a layout method of circuitries, i.e., a layout field, as well as in the circuitries and manufacturing processes of the semiconductor memory devices. As the chip size decreases, there may occur a phenomenon that a space through which global input/output lines pass becomes deficient. Also, test global input/output lines to which signals for testing global input/output lines and memory cores are transferred are generally connected together with all cores. As the number of the test global input/output lines increases, the number of the global input/output lines for constituting a layout increases too, which is problematic. In the related art, a method of decreasing the thickness or interval of lines through which the global input/output lines pass or a method of constituting test global input/output lines which avoid a portion where the global input/output lines pass has been used. However, the related art methods have caused new drawbacks that the complexity of the layout increases or a phenomenon badly affecting on the circuit operation occurs.

FIG. 1 is a block diagram illustrating a connection between global input/output lines and test global input/output lines between memory banks according to the related art.

Referring to FIG. 1, a memory device includes eight banks BANK0, BANK1, . . . , BANK7, and global input/output lines P0_RXD<0:17> . . . P3_RXD<0:17> and P0_TXD <0:17> . . . P3_TXD<0:17>. Since test global input/output lines T0, T1, T2, . . . and the global input/output lines P0_RXD<0:17>. . . P3_RXD<0:17> and P0_TXD<0:17>. . . P3_TXD<0:17> are connected together with all cores, it can be understood that the total number of the global lines increases.

As aforementioned, it is problematic that many lines increase the complexity in the layout of a chip.

SUMMARY OF THE INVENTION

It is, therefore, an object of the present invention to provide a memory device with global input/output lines that can be shared for other usage, thereby decreasing the total number of lines connected with a memory core.

It is another object of the present invention to provide a memory device that can decrease the complexity in the layout of a chip and prevent the degradation in the circuit performance.

In accordance with an aspect of the present invention, there is provided a memory device including: a plurality of banks; a global input/output line for transferring data input/output signals of the plurality of banks in a normal operation; and a bank selection signal transferring unit for transferring a plurality of test bank selection signals to the plurality of banks in a test mode.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A memory device with decrease in the number of global lines in accordance with exemplary embodiments of the present invention will be described in detail with reference to the accompanying drawings.

Figure 1:
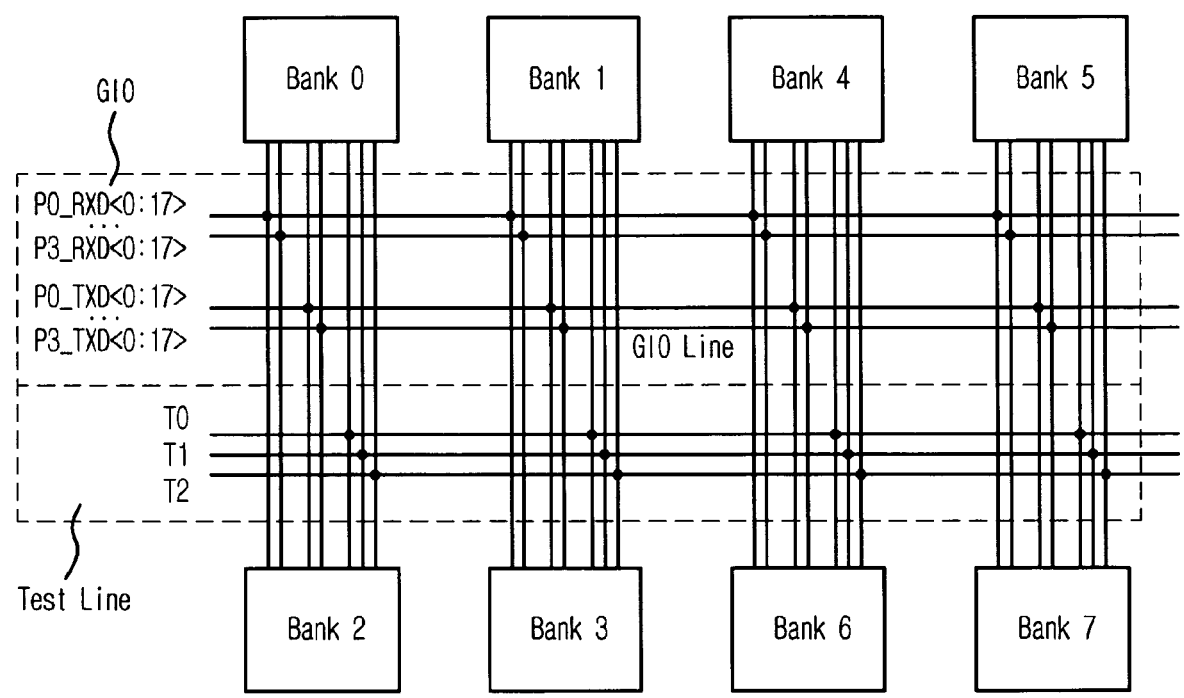
FIG. 1 is a block diagram illustrating a connection between global input/output lines and test global input/output lines between memory banks according to the related art.
Figure 2:
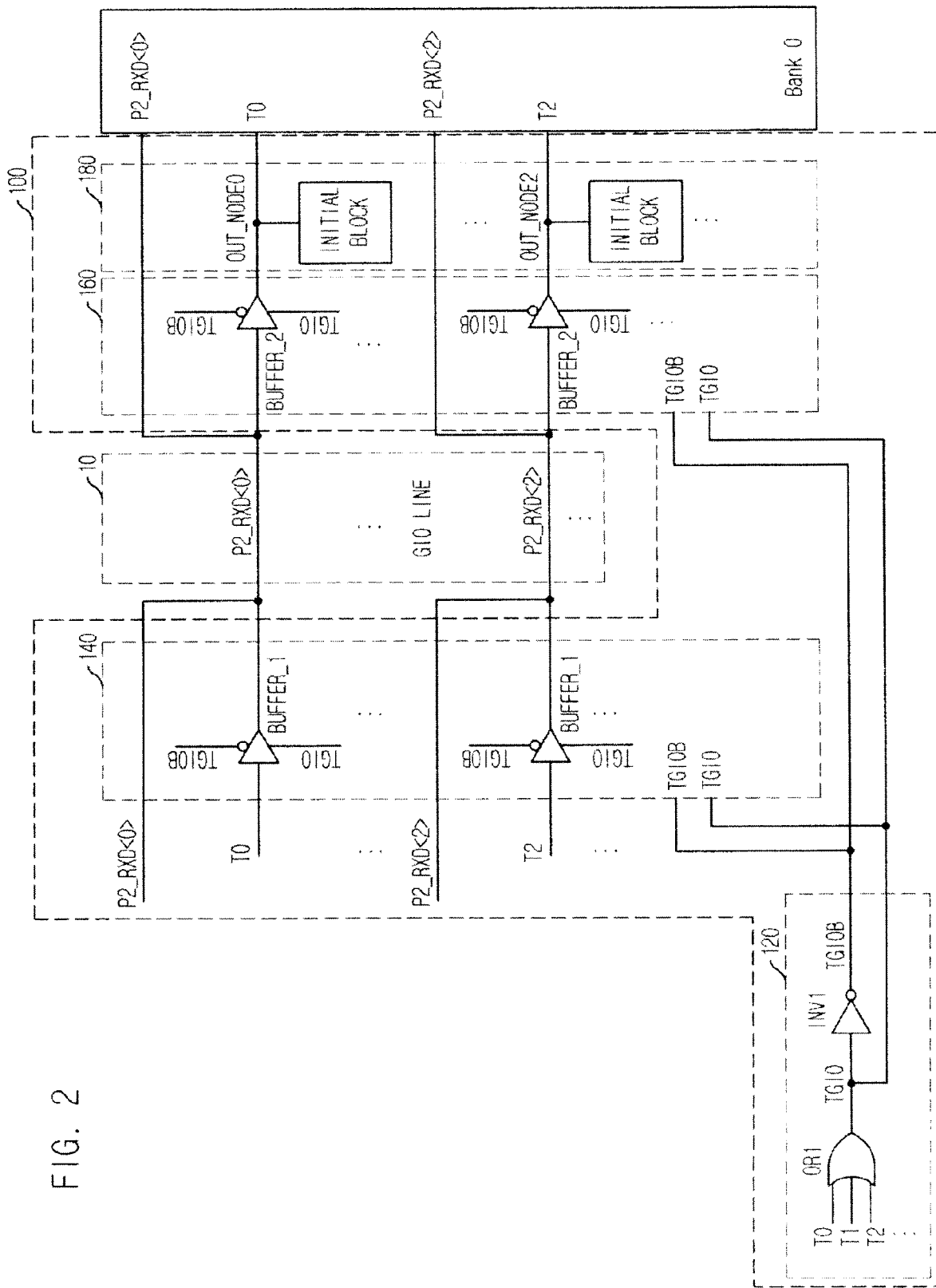
FIG. 2 is a circuit diagram illustrating a circuit having global input/output lines shared to transfer a test bank selection signal in accordance with an embodiment of the present invention.

FIG. 2 is a circuit diagram illustrating a circuit having global input/output (GIO) lines shared to transfer a test bank selection signal in accordance with an embodiment of the present invention.

The circuit includes a memory bank BANK0, global input/output lines 10 for transferring data input/output signals $P2_{13}$ RXD<0>, . . . , $P2_{13}$ RXD<2> of the bank BANK0 in a normal operation, and a bank selection signal transferring unit 100 for transferring a plurality of test bank selection signals T0, T1, T2, . . . to the bank BANK0 through the global input/output lines 10.

In the above circuit, the bank selection signal transferring unit 100 includes a transfer control signal generating unit 120 for determining a logic level of first and second transfer control signals TGIO and TGIOB in response to the plurality of test bank selection signals T0, T1, T2, . . . ; and first and second transfer units 140 and 160 for controlling transfer to the plurality of test bank selection signals T0, T1, T2, . . . to the bank BANK0 through the global input/output lines 10 in response to the first and second transfer control signals TGIO and TGIO.

In the bank selection signal transferring unit 100, an operation of the transfer control signal generating unit 120 will be described.

As at least one of the plurality of test bank selection signals T0, T1, T2, . . . is activated, the first and second transfer control signals TGIO and TGIOB which are complementary to each other are generated.

The transfer control signal generating unit 120 includes an OR gate OR1 which receives the plurality of test bank selection signals T0, T1, T2, . . . to output the first transfer control signal TGIO, and an inverter INV1 which inverts the first transfer control signal TGIO to output the second transfer control signal TGIOB.

In other words, as at least one of the plurality of test bank selection signals T0, T1, T2, . . . selecting the bank BANK0 is activated, the first and second transfer control signals TGIO and TGIOB representing a test operation are activated.

Next, construction of the first and second transfer units 140 and 160 will be described.

The first and second transfer unit includes a first transfer unit 140 for controlling transfer to the plurality of test bank selection signals T0, T1, T2, . . . to the global input/output lines 10 in response to the first and second transfer control signal TGIO and TGIOB, and a second transfer unit 160 for controlling to transfer the plurality of test bank selection signals T0, T1, T2, . . . inputted from the global input/output lines 10 to the bank BANK0 in response to the first and second transfer control signals TGIO and TGIOB.

The bank selection signal transferring unit 100 further includes an initializing unit 180 which initializes output nodes OUT_NODE0, . . . , OUT_NODE2, . . . of the second transfer unit 160 between the global input/output lines 10 and the bank BANK0.

The first transfer unit 140 includes a plurality of first tri-state buffers BUFFER_1 which controls transfer to the plurality of test bank selection signals T0, T1, T2, . . . to the global input/output lines 10 in response to the first and second transfer control signals TGIO and TGIOB.

The plurality of first tri-state buffers BUFFER_1 are provided one by one with respect to each of the plurality of test bank selection signals T0, T1, T2, . . . . That is, the plurality of first tri-state buffers BUFFER_1 are connected one to one with the plurality of test bank selection signals T0, T1, T2, . . . .

The second transfer unit 160 includes a plurality of second tri-state buffers BUFFER_2 which controls transfer to the plurality of test bank selection signals T0, T1, T2, . . . inputted from the global input/output lines 10 to the bank BANK0 in response to the first and second transfer control signals TGIO and TGIOB.

The plurality of second tri-state buffers BUFFER_2 are provided one by one with respect to each of the plurality of test bank selection signals T0, T1, T2, . . . . That is, the plurality of second tri-state buffers BUFFER_2 are connected one to one with the plurality of test bank selection signals T0, T1, T2, . . . .

The initialization unit 180 is provided at each of the plurality of second tri-state buffers BUFFER_2.

The initializing unit 180 includes a plurality of initializing blocks, which are provided one by one with respect to each of the plurality of second tri-state buffers BUFFER_2.

Figure 3A:
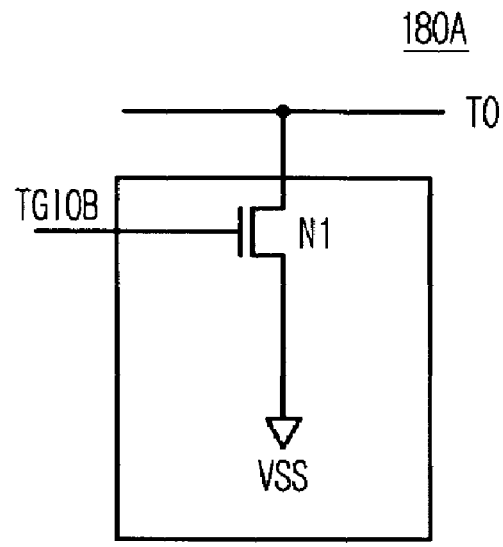
FIG. 3A is a detailed circuit diagram of an initializing block in accordance with an embodiment of the present invention.
Figure 3B:
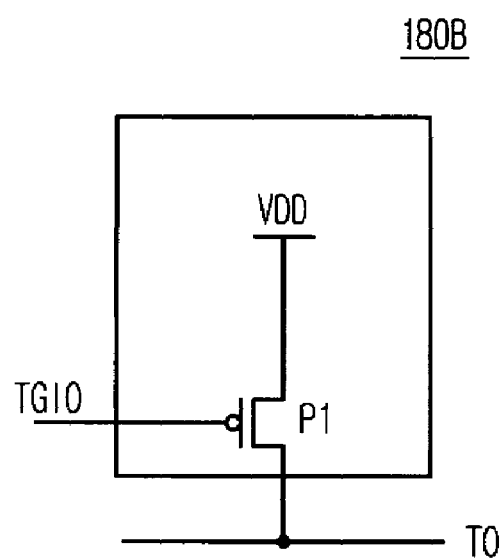
FIG. 3B is a detailed circuit diagram of an initializing block in accordance with another embodiment of the present invention.

FIG. 3A is a detailed circuit diagram of the initializing block in accordance with an embodiment of the present invention; and FIG. 3B is a detailed circuit diagram of the initializing block in accordance with another embodiment of the present invention.

Referring to FIGS. 3A and 3B, the initializing unit 180 initializes the output nodes OUT_NODE0, . . . , OUT_NODE2, . . . of the second transfer unit 160 when the first and second transfer units 140 and 160 are turned off in response to the first and second transfer control signals TGIO and TGIOB. That is, the initializing block initializes a corresponding one of the output nodes OUT_NODE0, . . . , OUT_NODE2, . . . of the second transfer unit 160 while the plurality of test bank selection signals T0, T1, T2, . . . are not transferred.

In an embodiment shown in FIG. 3A, the initializing block 180A includes an NMOS transistor N1 which is responsive to the second transfer control signal TGIOB to initialize the plurality of test bank selection signals T0, T1, T2, . . . using a ground voltage VSS. In detail, the NMOS transistor N1 includes a gate receiving the second transfer control signal TGIOB and a source-drain path between the output nodes OUT_NODE0, . . . , OUT_NODE2, . . . of the second transfer unit and the ground voltage VSS.

In another embodiment shown in FIG. 3B, the initializing block 180B includes a PMOS transistor P1 which is responsive to the first transfer control signal TGIO to initialize the plurality of test bank selection signals T0, T1, T2, . . . using a power voltage VDD. In detail, the PMOS transistor P1 includes a gate receiving the first transfer control signal TGIO and a source-drain path between the output nodes OUT_NODE0, . . . , OUT_NODE2, . . . of the second transfer unit and the power voltage VDD.

While the above embodiments show and describe that the global input/output lines and the test bank selection signals T0, T1, T2, . . . are connected to one bank BANK0, the present invention can be applied to a case of a plurality of banks.

As described above, by employing the present embodiments, the global input/output lines used for transferring data input/output signals in a normal operation can be shared as a usage for transferring test bank selection signals in a core test mode for testing a core region of the bank in a test operation, thereby omitting an additional test input/output line. In other words, the number of lines used inside a chip is decreased to reduce the complexity in the layout of the chip, and an interval between the lines is properly maintained to prevent the circuit performance from being degraded.

The present application contains subject matter related to the Korean patent application No. KR 2006-43981, filed in the Korean Patent Office on May 16, 2006, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A semiconductor memory device, comprising:
   a plurality of banks;
   a plurality of global input/output lines for transferring data input/output signals of the plurality of banks in a normal operation and a plurality of test bank selection signals in a test mode;
   a bank selection signal transferring unit including a transfer unit for controlling the plurality of global input/output lines to transfer the plurality of test bank selection signals to the plurality of banks through the global input/output lines in the test mode; and
   an initializing unit for initializing an output node of a second transfer unit of the transfer unit;
   wherein the initializing unit initializes the output node of the second transfer unit when a first transfer unit of the transfer unit and the second transfer unit are turned off in response to first and second transfer control signals.

2. The semiconductor memory device of claim 1, wherein the test mode is a core test mode for testing a core region of the plurality of banks.

3. The semiconductor memory device of claim 2, wherein the bank selection signal transferring unit includes:
   a transfer control signal generating unit for generating the transfer control signals in response to the plurality of test bank selection signals; and
   the transfer unit for controlling a transfer of the plurality of test bank selection signals to the plurality of banks through the global input/output line in response to the transfer control signal.

4. The semiconductor memory device of claim 3, wherein the transfer control signal generating unit generates the first and second transfer control signals which are complementary to each other when at least one of the plurality of test bank selection signals is activated.

5. The semiconductor memory device of claim 4, wherein the transfer control signal generating unit includes:
   an OR gate for receiving the plurality of test bank selection signals to output the first transfer control signal; and
   an inverter for inverting the first transfer control signal to output the second transfer control signal.

6. The semiconductor memory device of claim 4, wherein the transfer unit includes:
   a first transfer unit for transferring the plurality of test bank selection signals to the global input/output line in response to the first and second transfer control signals; and
   a second transfer unit for transferring the plurality of test bank selection signals inputted from the global input/output line to the plurality of banks in response to the first and second transfer control signals.

7. The semiconductor memory device of claim 6, wherein the first transfer unit includes a plurality of first tri-state buffers for transferring the plurality of test bank selection signals to the global input/output line in response to the first and second transfer control signals.

8. The semiconductor memory device of claim 7, wherein the plurality of first tri-state buffers are provided one by one with respect to the plurality of test bank selection signals.

9. The semiconductor memory device of claim 6, wherein the second transfer unit includes a plurality of second tri-state buffers for transferring the plurality of test bank selection signals inputted from the global input/output line to the plurality of banks in response to the first and second transfer control signals.

10. The semiconductor memory device of claim 9, wherein the plurality of second tri-state buffers are provided one by one with respect to the plurality of test bank selection signals.

11. The semiconductor memory device of claim 9, wherein the initializing unit is provided with respect to each of the plurality of second tri-state buffers.

12. The semiconductor memory device of claim 6, wherein the initializing unit initializes the plurality of test bank selection signals using a ground voltage in response to the second transfer control signal.

13. The semiconductor memory device of claim 12, wherein the initializing unit includes an NMOS transistor having a gate receiving the second transfer control signal and a source-drain path between the output node of the second transfer unit and the ground voltage.

14. The semiconductor memory device of claim 6, wherein the initializing unit initializes the plurality of test bank selection signals using a power voltage in response to the first transfer control signal.

15. The semiconductor memory device of claim 14, wherein the initializing unit includes a PMOS transistor having a gate receiving the first transfer control signal and a source-drain path between the output node of the second transfer unit and the power voltage.

* * * * *